United States Patent
Chapple-Sokol et al.

(10) Patent No.: US 9,685,370 B2
(45) Date of Patent: Jun. 20, 2017

(54) TITANIUM TUNGSTEN LINER USED WITH COPPER INTERCONNECTS

(71) Applicant: INTERNATIONAL BUSINESS MACHINES CORPORATION, Armonk, NY (US)

(72) Inventors: Jonathan D. Chapple-Sokol, Essex Junction, VT (US); Cathryn J. Christiansen, Huntington, VT (US); Jeffrey P. Gambino, Westford, VT (US); Tom C. Lee, Essex Junction, VT (US); William J. Murphy, North Ferrisburgh, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/574,889

(22) Filed: Dec. 18, 2014

(65) Prior Publication Data

US 2016/0181151 A1 Jun. 23, 2016

(51) Int. Cl.
*H01L 21/768* (2006.01)
*H01L 23/522* (2006.01)
*H01L 23/532* (2006.01)

(52) U.S. Cl.
CPC .. *H01L 21/76846* (2013.01); *H01L 21/76858* (2013.01); *H01L 23/5226* (2013.01); *H01L 23/53238* (2013.01); *H01L 23/53266* (2013.01); *H01L 23/53295* (2013.01); *H01L 2924/0002* (2013.01)

(58) Field of Classification Search
CPC ................... H01L 23/53238; H01L 2924/012–2924/01208; H01L 21/76846
See application file for complete search history.

(56) References Cited

U.S. PATENT DOCUMENTS

| | | | |
|---|---|---|---|
| 6,140,238 A | 10/2000 | Kitch | |
| 6,210,502 B1 * | 4/2001 | Takahashi | C22F 1/183 148/421 |
| 6,586,310 B1 * | 7/2003 | Choi | H01L 27/11 257/E21.661 |
| 6,900,539 B2 | 5/2005 | Motoyama | |
| 7,087,997 B2 | 8/2006 | Burrell et al. | |

(Continued)

FOREIGN PATENT DOCUMENTS

JP 2004311865 A 11/2004

OTHER PUBLICATIONS

Gambino "Improved Reliability of Copper Interconnects Using Alloying", 17th IEEE International Symposium on the Physical and Failure Analysis of Integrated Circuits (IPFA), 2010, 7 pages.

(Continued)

*Primary Examiner* — Joseph C Nicely
(74) *Attorney, Agent, or Firm* — David Cain; Andrew M. Calderon; Roberts Mlotkowski Safran Cole & Calderon, P.C.

(57) ABSTRACT

Approaches for providing a liner at a via-to-wire interface are provided. A method includes: forming a via opening that exposes an upper surface of a copper wire; forming a titanium liner on the upper surface of the wire; forming a tungsten liner on the titanium liner; and forming a via on the second liner in the via opening.

19 Claims, 5 Drawing Sheets

(56) References Cited

U.S. PATENT DOCUMENTS

| | | | | |
|---|---|---|---|---|
| 7,245,018 B1* | 7/2007 | Takayama | C23C 14/165 | 257/763 |
| 7,964,966 B2 | 6/2011 | Yang et al. | | |
| 8,148,257 B1* | 4/2012 | Barth | H01L 21/76846 | 257/E21.575 |
| 8,304,343 B2* | 11/2012 | Choi | H01L 21/76814 | 257/E21.584 |
| 8,513,112 B2 | 8/2013 | Ahn et al. | | |
| 8,802,559 B2* | 8/2014 | Yang | H01L 21/76846 | 257/751 |
| 2002/0127849 A1* | 9/2002 | Lin | H01L 21/76843 | 438/638 |
| 2003/0008495 A1* | 1/2003 | Hsue | H01L 21/76838 | 438/627 |
| 2003/0027427 A1* | 2/2003 | Ma | H01L 21/76802 | 438/700 |
| 2004/0150112 A1* | 8/2004 | Oda | H01L 23/53238 | 257/758 |
| 2005/0156315 A1* | 7/2005 | Lee | H01L 21/2855 | 257/751 |
| 2006/0012046 A1* | 1/2006 | Koura | H01L 21/2885 | 257/758 |
| 2007/0052096 A1* | 3/2007 | Su | H01L 21/28562 | 257/744 |
| 2007/0077761 A1 | 4/2007 | Lehr et al. | | |
| 2007/0190692 A1* | 8/2007 | Erturk | H01L 21/76898 | 438/118 |
| 2008/0122103 A1* | 5/2008 | Bonilla | H01L 21/76825 | 257/767 |
| 2008/0128907 A1 | 6/2008 | Yang et al. | | |
| 2011/0011737 A1* | 1/2011 | Wu | H01J 37/3405 | 204/298.16 |
| 2012/0009781 A1* | 1/2012 | Choi | H01L 21/76814 | 438/653 |
| 2013/0113102 A1* | 5/2013 | Bao | H01L 21/76846 | 257/751 |
| 2013/0148194 A1* | 6/2013 | Altug | G01N 21/658 | 359/350 |
| 2013/0177138 A1* | 7/2013 | Komoto | G21K 1/067 | 378/145 |
| 2013/0228926 A1* | 9/2013 | Maeda | H01L 27/1225 | 257/751 |
| 2013/0230422 A1* | 9/2013 | Mori | A61L 27/06 | 417/437 |
| 2014/0154877 A1* | 6/2014 | Besser | H01L 29/4966 | 438/586 |
| 2014/0235054 A1* | 8/2014 | Lansalot-Matras | C07F 11/005 | 438/681 |
| 2015/0004784 A1* | 1/2015 | Yokoyama | H01L 21/76877 | 438/653 |
| 2015/0050753 A1* | 2/2015 | Srinivasan | H01L 21/6719 | 438/5 |
| 2015/0225870 A1* | 8/2015 | Katoh | C30B 11/002 | 117/223 |
| 2015/0294906 A1* | 10/2015 | Wu | H01L 21/76877 | 438/653 |

OTHER PUBLICATIONS

Nogami et al., "High reliability 32nm Cu/ULK BEOL based on PVD CuMn seed, and its extendibility", In IEEE International Electron Devices Meeting (IEDM), 2010, Abstract only, 1 page.

Teng et al., "Reliability Investigations of Down-Stream Copper Interconnect with Different Tungsten-VIA Structures", IEEE International Integrated Reliability Workshop Final REport (IRW), 2012, pp. 36-40.

Saito et al., "A Reliability Study of Barrier-Metal-Clad Copper Interconnects With Self-Aligned Metallic Caps", IEEE Transactions on Electron Devices, vol. 51, No. 12, 2004, pp. 2129-2135.

Wu et al., "Ti-based barrier for Cu interconnect applications", IEEE Interconnect Technology Conference, 2008, pp. 202-204.

Teng et al., "Reliability Assessment of Tungsten Via to Copper Interconnect for Novel Memory Device", IEEE International Interconnect Technology Conference, 2012, Abstract, 1 page.

* cited by examiner

TITANIUM TUNGSTEN LINER USED WITH COPPER INTERCONNECTS

FIELD OF THE INVENTION

The invention relates to semiconductor structures and methods of forming the same and, more particularly, to liners used with copper interconnects in integrated circuits.

BACKGROUND

Semiconductor devices generally include a plurality of circuits which form an integrated circuit fabricated on a substrate. A network of signal paths is normally routed to connect the circuit elements distributed on the surface of the substrate. Efficient routing of these signals across the device requires formation of multilevel or multilayered schemes, such as, for example, single or dual damascene wiring structures. Within a typical network of signal paths, metal vias (e.g., studs) run substantially perpendicular to the top surface of the substrate and metal lines (e.g., wires, interconnects) run substantially parallel to the top surface of the substrate.

The interface where a via lands on a wire (interconnect) is susceptible to stress migration failure characterized by voids (vacancies) that form in the conductive material. Stress migration failure in a copper (Cu) interconnect is problematic due to the fast diffusing interface between the Cu wire and the nitride capping layer over the wire. As vacancies in the Cu diffuse, they move to the Cu/nitride interface and diffuse to the wire-to-via interface. An accumulation of such vacancies can result in an open connection, which results in a lack of electrical conduction and failure of the circuit. Since there is typically no redundant path between the top of the Cu wire and the via, a small amount of voiding can lead to a failed connection. In fact, a slit void is sufficient in most cases to lead to circuit failure.

An approach to addressing the stress migration failure in general is to utilize a silicon-rich copper-to-nitride interface to slow the vacancy diffusion. However, this approach disadvantageously causes unwanted variability of the metal resistance (Rs). Moreover, this approach ignores the via-to-wire interface as the fail location.

Another approach to addressing the stress migration failure in general is to dope a Cu seed layer to reduce vacancy diffusion. For example, a copper-manganese (CuMn) layer may be formed on top of the Cu wire. However, this approach disadvantageously causes unwanted loss of metal resistance (Rs). Moreover, this approach ignores the via-to-wire interface as the fail location.

An approach to addressing the stress migration failure at the via-to-wire interface is to employ via liner re-sputtering to gouge the Cu wire. This ensures a tantalum (Ta) to Cu interface which advantageously avoids nitrides at the Cu interface. However, this approach disadvantageously induces sputter damage into the Cu wire, which pre-disposes vacancy sites at the via-to-wire interface.

Another approach to addressing the stress migration failure at the via-to-wire interface is to provide the Cu wire with capping layers, such as cobalt tungsten phosphide (CoWP) or tantalum/tantalum nitride (Ta/TaN). For example, a redundant layer may be added to the top surface of the Cu wire after a chemical mechanical polish (CMP) of the Cu wire. The layer may comprise CoWP; however, CoWP is selective and expensive to process. The layer may comprise Ta/TaN; however, this requires an additional mask level to the etch cap and results in overlay and leakage penalties.

Other approaches include using a TaN/TiN or a Ti/TiN/Ti liner with the via. Using a TaN/TiN liner places a nitride material directly on the Cu wire, which results in the same problem as the nitride capping layer in the first place, i.e., a fast diffusing interface between the Cu wire and the nitride capping layer over the wire. Using a Ti/TiN/Ti liner typically results in nitrogen poisoning of the Ti liner, which disadvantageously results in the presence of the nitrogen at the Cu interface and thus induces adhesion problems associated with Cu and metal nitrides.

SUMMARY

In a first aspect of the invention, there is a method of forming a semiconductor structure. The method includes: forming a via opening that exposes an upper surface of a copper wire; forming a titanium liner on the upper surface of the wire; forming a tungsten liner on the titanium liner; and forming a via on the second liner in the via opening.

In another aspect of the invention, there is a method of forming a semiconductor structure. The method includes: forming a copper wire in a first layer of dielectric material; forming a capping layer on the wire and the first layer of dielectric material; forming a second layer of dielectric material on the capping layer; etching a via opening in the second layer of dielectric material and the capping layer to expose an upper surface of the wire; forming a titanium liner in the via opening and on the upper surface of the wire; forming a tungsten liner in the via opening and on the titanium liner; and forming a tungsten via in the via opening and on the second liner.

In another aspect of the invention, there is a semiconductor structure that includes: a copper wire in a first layer of dielectric material; a capping layer on and contacting the wire and the first layer of dielectric material; a second layer of dielectric material on the capping layer; a via opening extending through the second layer of dielectric material and the capping layer to an upper surface of the wire; a titanium liner in the via opening and on and contacting the upper surface of the wire; a tungsten liner in the via opening and on the titanium liner; and a tungsten via in the via opening and on the second liner.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of forming the same and, more particularly, to liners used with copper interconnects in integrated circuits. According to aspects of the invention, a sputtered titanium and tungsten liner is provided at the interface between a via and an underlying interconnect. In embodiments, the liner is devoid of nitride and includes a first layer of pure titanium and a second layer of pure tungsten. In embodiments, the titanium forms an alloy with the copper of the interconnect, which alloy improves the adhesion of the via to the interconnect. In this manner, implementations of the invention provide a robust, nitride-free interface between the via and the interconnect that avoids the vacancy diffusion problems associated with conventional liners.

The structures of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition of thin films of material on a substrate, (ii) applying a patterned mask on top of the films by photolithographic imaging, and (iii) etching the films selectively to the mask.

Figure 1:
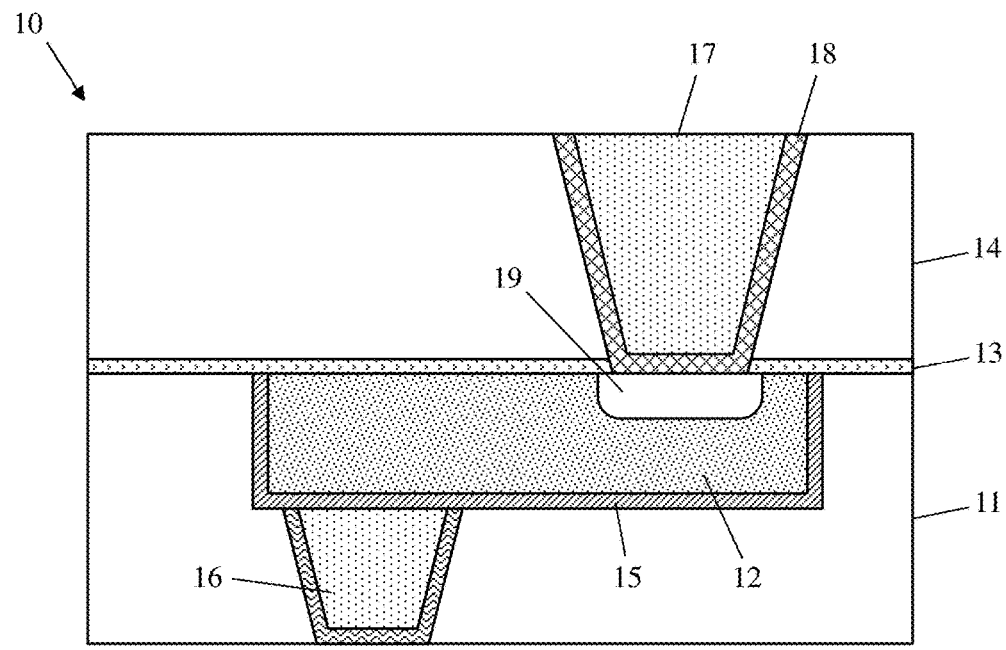
FIG. 1 shows a stress migration induced void at a via-to-wire interface.

FIG. 1 shows a structure 10 with a stress migration induced void at a via-to-wire interface. The structure 10 comprises a multilevel semiconductor device including a first dielectric layer 11 containing a Cu wire 12 (e.g., interconnect). A capping layer 13 comprising nitride (e.g., SiN, $Si_3N_4$) is provided over the first dielectric layer 11 and the wire 12, and a second dielectric layer 14 is disposed over the capping layer 13. A diffusion barrier (e.g., liner) 15 comprising TaN/Ta is disposed between the first dielectric layer 11 and the wire 12. A contact 16 is in the first dielectric layer 11 below and electrically contacting the wire 12. A via 17 comprising tungsten (W) is formed in the second dielectric layer 14. A liner 18 comprising nitride (e.g., TaN/TiN) is formed around the via 17 and directly contacts the Cu wire 12 at a location where the capping layer 13 has been removed.

As depicted in FIG. 1, a void 19 typically forms at the via-to-wire interface due to stress migration. Specifically the poor adhesion between the nitride of the liner 18 and the Cu of the wire 12 creates a fast diffusion interface toward which vacancies in Cu diffuse. Over time, an accumulation of vacancies result in the void 19 becoming sufficiently large to interrupt electrical continuity between the via 17 and the wire 12, which results in circuit failure. Aspects of the invention avoid this problem by eliminating the nitride-Cu interface, thus suppressing void nucleation at the via-to-wire interface.

FIGS. 2-8 show structures and respective processing steps in accordance with aspects of the invention. The process flow of the present invention may begin with providing the initial structure 100 shown in FIG. 2. In embodiments, the structure 100 comprises a multilevel semiconductor device including a first dielectric layer 101 containing a wire 102 (e.g., interconnect). A capping layer 103 is provided over the first dielectric layer 101 and the wire 102, and a second dielectric layer 104 is disposed over the capping layer 103. A diffusion barrier (e.g., liner) 105 is disposed between the first dielectric layer 101 and the wire 102. A contact 106 may be formed the first dielectric layer 101 below and electrically contacting the wire 102.

The structure 100 as thus described can be made using conventional techniques known to those of skill in the art. For example, the structure 100 may be formed by applying the first dielectric layer 101 to a surface of a substrate (not shown). The substrate may comprise a semiconductor material, an insulating material, a conductive material, or any combination thereof. When the substrate is comprised of a semiconductor material, any semiconductor material may be used, such as, for example, Si, SiGe, SiGeC, SiC, GE alloys, GaAs, InAs, InP, and other III/V or II/VI compound semiconductors. Moreover, the present invention also contemplates cases in which the substrate is a layered semiconductor, such as, for example, Si/SiGe, Si/SiC, silicon-on-insulator (SOI), or silicon germanium-on-insulator (SGOI).

When the substrate is an insulating material, the insulating material can be an organic insulator, an inorganic insulator, or a combination thereof. When the substrate is a conducting material, the substrate may include, for example, polysilicon, elemental metal, alloys of elemental metals, metal silicide, metal nitride, or combinations thereof. When the semiconductor comprises a semiconductor material, one or more semiconductor devices, such as, for example, complementary metal oxide semiconductor (CMOS) devices can be fabricated thereon.

The first dielectric layer 101 may comprise any suitable interlevel or intralevel dielectric material, and may be porous or non-porous. Suitable materials include, but are not limited to, $SiO_2$, $Si_3N_4$, SiCOH, silsesquioxanes, C doped oxides (i.e., organosilicates) that include atoms of Si, C, O, and/or H, thermosetting polyarylene ethers, SiLK (a polyarylene ether available from Dow Chemical Corporation), JSR (a spin-on silicon-carbon contained polymer material available from JSR Corporation), etc., or layers thereof. The term "polyarylene" is used in this application to denote moieties or inertly substituted aryl moieties which are linked together by bonds, fused rings, or inert linking groups, such as, for example, oxygen, sulfur, sulfone, sulfoxide, carbonyl, and the like. In embodiments, the material of the first dielectric layer 101 has a dielectric constant, k, of about 4.0 or less, and has a thickness in the range of about 200 nm to 450 nm. It is understood, however, that other materials having a different dielectric constant and/or thickness may be employed within the scope of the invention.

Figure 2:
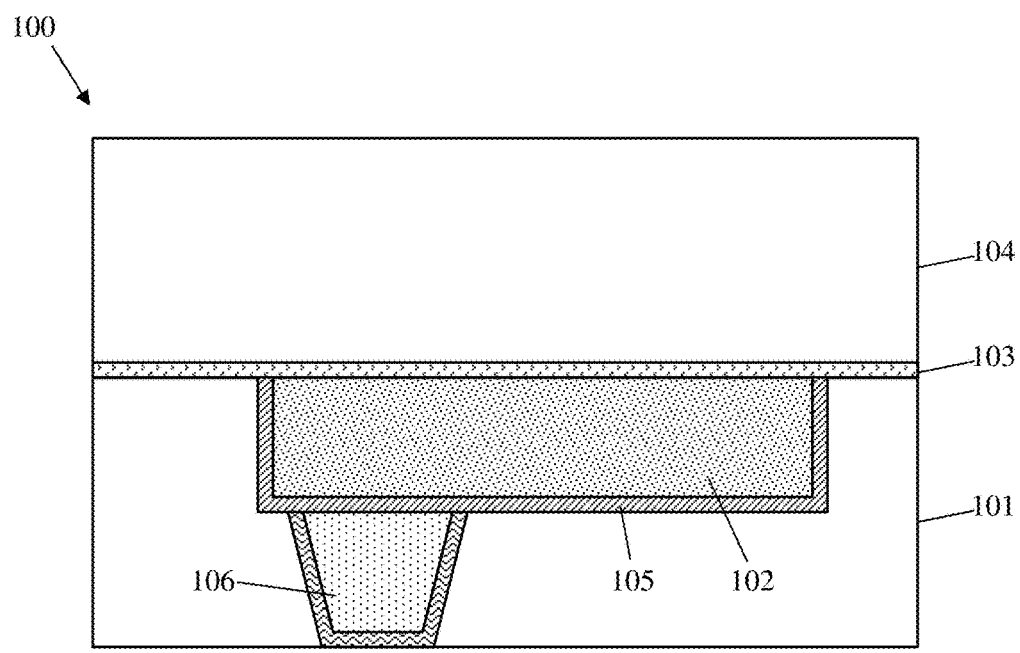
FIGS. 2-7 show structures and respective processing steps in accordance with aspects of the invention.

Still referring to FIG. 2, in embodiments, the wire 102 and barrier layer 105 are formed using conventional semiconductor processes including photolithography, etching, and material deposition. For example, the wire 102 and barrier layer 105 may be formed by: applying a photoresist to the surface of the first dielectric layer 101, exposing the photoresist to a desired pattern of radiation, developing the exposed resist utilizing a conventional resist developer, etching (dry etching or wet etching) an opening in the first dielectric layer 101 through the patterned photoresist, forming the barrier layer 105 on surfaces of the etched region, and forming a conductive material of the wire 102 on surfaces of the barrier layer 105 to fill the remainder of the etched region.

The barrier layer 105 may comprise, for example, Ta, TaN, Ti, TiN, Ru, RuN, W, WN, or any other material that can serve as a barrier to prevent conductive material from diffusing therethrough. The barrier layer 105 can be formed by a deposition process such as, for example, atomic layer deposition (ALD), chemical vapor deposition (CVD), plasma enhanced chemical vapor deposition (PECVD), physical vapor deposition (PVD) such as sputtering, chemical solution deposition, or plating. In embodiments, the barrier layer 105 has a thickness in the range of about 4 nm to 40 nm, with a thickness from 7 nm to 20 nm being more typical.

The conductive material used in forming the wire 102 includes, for example, polySi, a conductive metal, an alloy comprising at least two conductive metals, a conductive metal silicide or combinations thereof. In a particular embodiment, the wire 102 is comprised of Cu or a Cu alloy (such as AlCu). The conductive material is filled into the remaining opening in the first dielectric layer 101 utilizing a conventional deposition process including, but not limited to, CVD, PECVD, sputtering, chemical solution deposition or plating. After deposition, a conventional planarization process such as, for example, chemical mechanical polishing (CMP) can be used to provide a structure in which the barrier layer 105 and the wire 102 each have an upper surface that is substantially coplanar with the upper surface of the first dielectric layer 101.

After forming the wire 102, the capping layer 103 is formed using a conventional deposition process, such as, for example, chemical vapor deposition (CVD), atomic layer deposition (ALD), physical vapor deposition (PVD), plasma enhanced chemical vapor deposition (PECVD), etc. The capping layer 103 may comprise, for example, SiC, $Si_3N_4$, $SiO_2$, SiC(N,H) (i.e., nitrogen or hydrogen doped silicon carbide), etc., and may have a thickness in the range of about 15 nm to 55 nm, with a thickness from 25 nm to 45 nm being more typical.

The second dielectric layer 104 is applied to the upper exposed surface of the capping layer 103. The second dielectric layer 104 may comprise the same or different dielectric material as that of the first dielectric layer 101. Moreover, the processing techniques and thickness ranges described above with respect to the first dielectric layer 101 are also applicable to the second dielectric layer 104.

Figure 3:
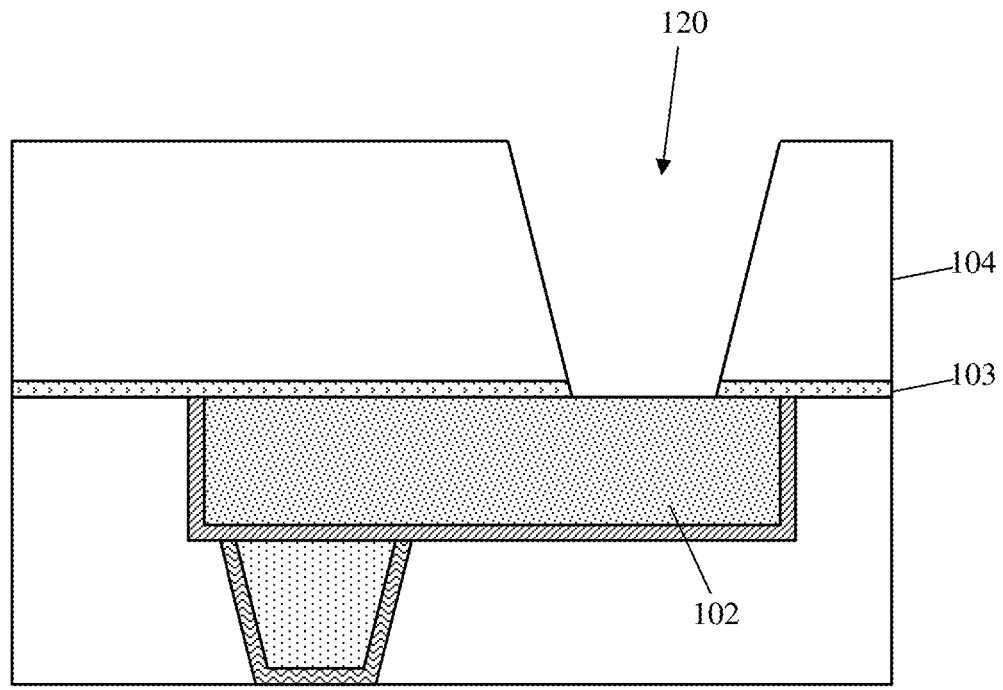

As shown in FIG. 3, a via opening 120 is formed in the second dielectric layer 104 and the capping layer 103 to expose an upper surface of the wire 102. The via opening 120 may be formed using photolithographic masking and etching, for example using a reactive ion etch (RIE) process. The etch used to form the via opening 120 may be configured, e.g., through etch chemistry and/or timing, to completely remove the material of the capping layer 103 from the exposed portion of the upper surface of the wire 102. After the etch, the surfaces exposed in the via opening 120 may be cleaned using buffered hydrofluoric acid (BHF).

Figure 4:
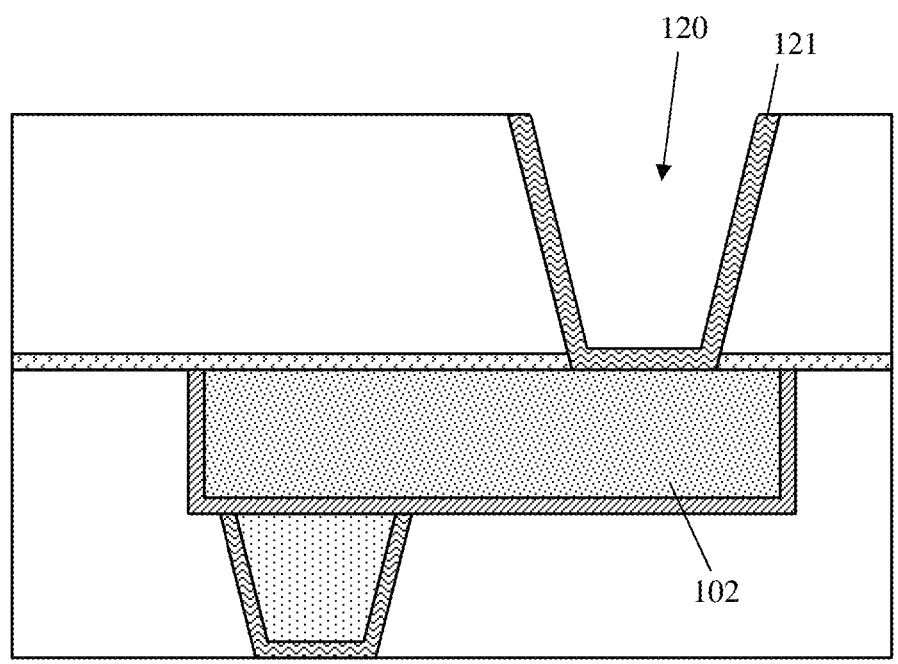

As shown in FIG. 4, a first liner 121 is formed on exposed surfaces of the second dielectric layer 104 and the wire 102 in the via opening 120. In embodiments, the first liner 121 is composed of titanium (Ti). Preferably, the first liner is high purity Ti having at least 99.995% purity (i.e., 4N5 purity) to avoid inclusion of elements that may facilitate void formation at the interface between the first liner 121 and the wire 102. The first liner 121 may be formed using ionized physical vapor deposition (ionized PVD), e.g., magnetron sputtering, with a thickness in the range of about 5 nm to 25 nm, although other suitable deposition processes and thicknesses may be used in forming the high purity Ti liner. As illustrated in FIG. 4, the material of the first liner 121 directly contacts the upper surface of the Cu wire 102.

Figure 5:
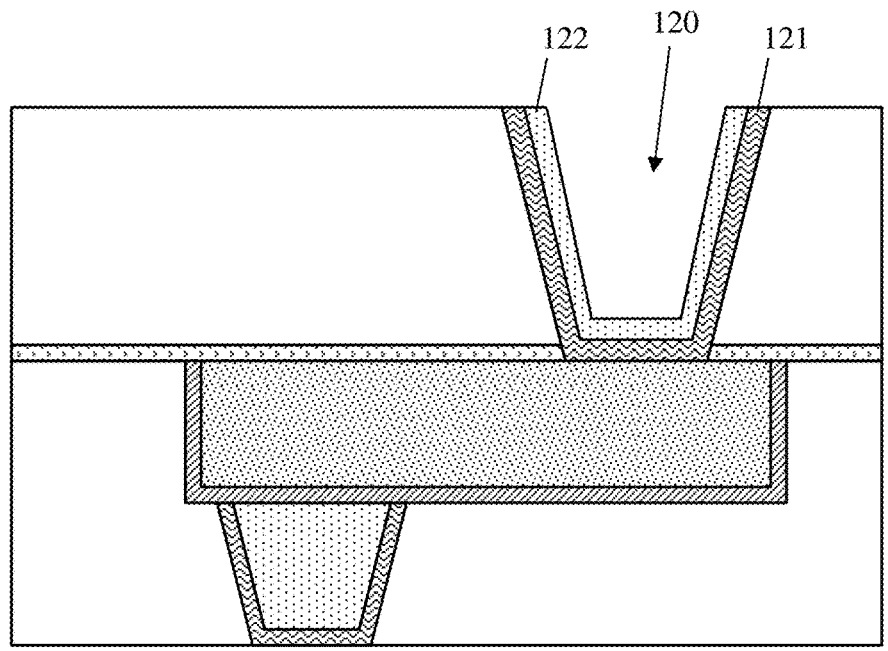

As shown in FIG. 5, a second liner 122 is formed on the exposed surfaces of the first liner 121 in the via opening. In embodiments, the second liner 122 is composed of tungsten (W). Preferably, the second liner 122 is composed of high purity W having at least 99.995% purity (i.e., 4N5 purity). The second liner 122 may be formed using ionized physical vapor deposition (ionized PVD) with a thickness in the range of about 5 nm to 35 nm, although other suitable deposition processes and thicknesses may be used in forming the high purity W liner.

According to aspects of the invention, the post etch cleaning, forming the first liner 121, and forming the second liner 122 are performed in an integrated process without any air breaks. Specifically, the wafer is not exposed to atmosphere following the post-etch cleaning and prior to forming the first liner 121, and the wafer is not exposed to atmosphere following forming the first liner 121 and prior to forming the second liner 122. A multi-chamber deposition tool may be used to perform the deposition processes without an air break. Aspects of the invention utilize high purity Ti and high purity W, combined with the performing the first and second depositions without an air break, to advantageously prevent nitrided metals from coming into contact with and connecting to the Cu of the wire 102. The avoidance of nitride on the Cu of the via-to-wire interface is advantageous since, as described herein, nitrogen causes fast diffusion interfaces with Cu, and because Cu has poor adhesion with nitrided metals.

Figure 6:
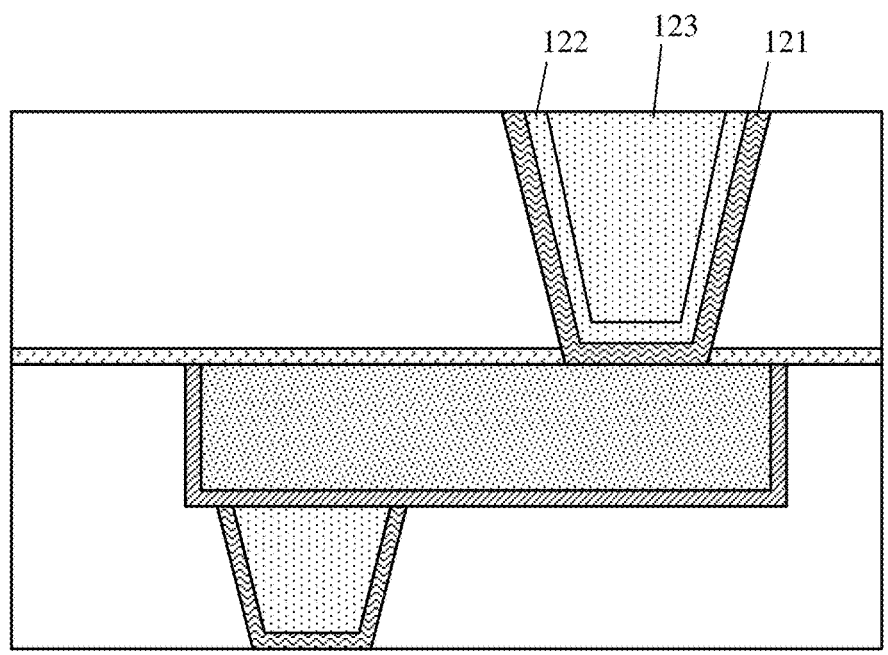

As shown in FIG. 6, a via 123 is formed in the remainder of the via opening on the exposed surfaces of the second liner 122. In embodiments, the via 123 is composed of tungsten (W). The via 123 may be formed using a conventional tungsten chemical vapor deposition (W CVD) process. The tungsten of the via 123 may be of a lower purity than that of the second liner 122. A cleaning and planarization step (e.g., CMP) may be performed on the top surface of the wafer following the formation of the via 123, after which additional conventional processing steps may be performed.

Figure 7:
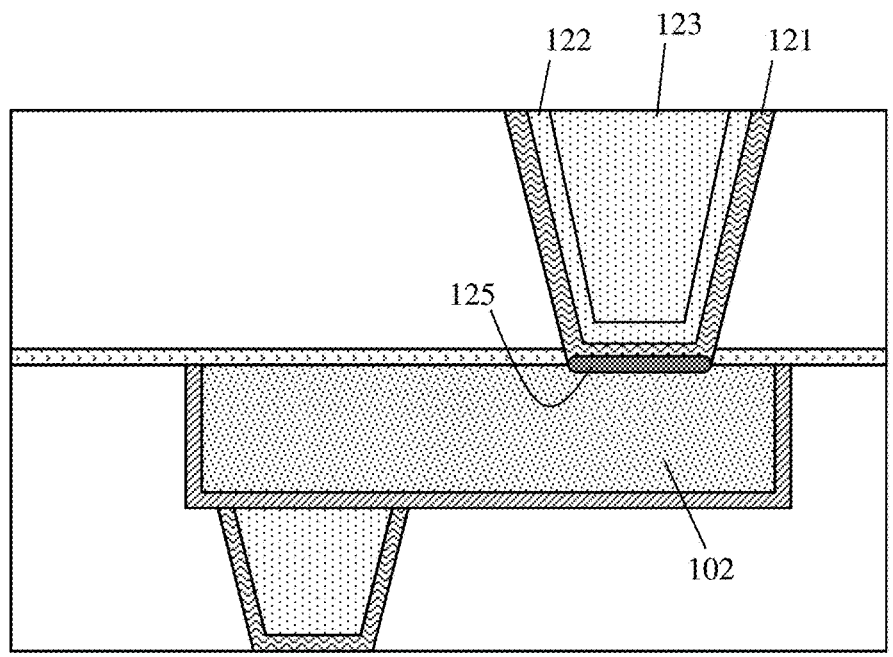
Figure 8:
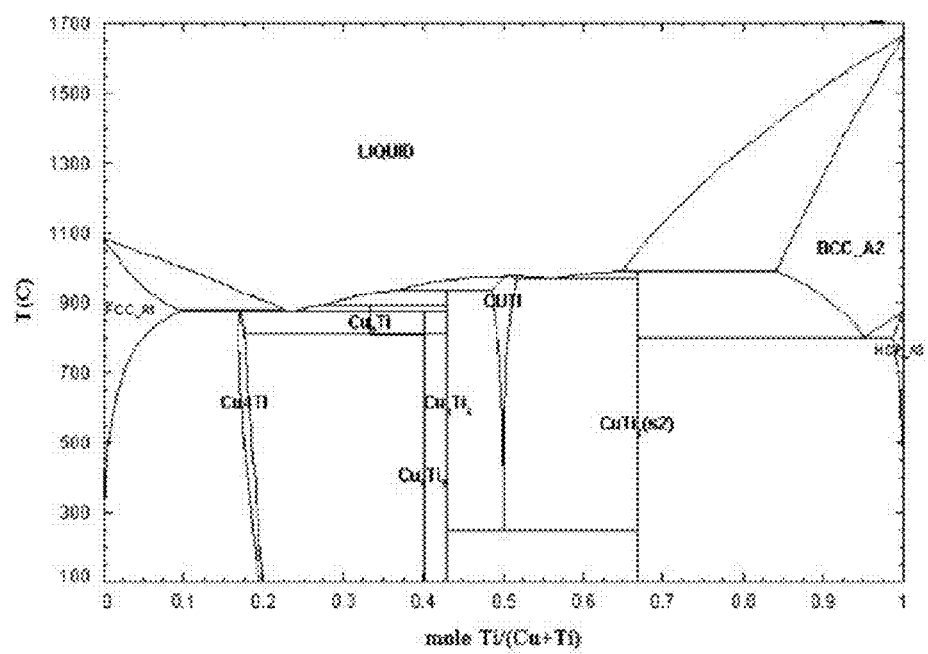
FIG. 8 shows a phase diagram.

As shown in FIG. 7, the Ti of the first liner 121 and the Cu of the wire 102 form a copper-titanium alloy region 125 at the via-to-wire interface when the wafer is heated during subsequent processing (e.g., during annealing performed in later processing steps). FIG. 8 shows a Cu—Ti phase diagram, and demonstrates that two phases are present between 100° C. and 300° C., which temperatures are reached by the wafer during certain annealing steps in conventional back end of the line processes. The Cu—Ti alloy region 125 provides a robust interface at the via-to-wire interface, and eliminates the potential for nitrogen poisoning of the material at the via-to-wire interface.

With continued reference to FIG. 7, according to aspects of the invention the first liner 121 and the second liner 122 constitute a nitride-free, multilayer Ti/W liner between the via 123 and the wire 102. This multilayer Ti/W liner differs from a conventional TiW film in that the conventional TiW film is a mixture of Ti and W in a single layer. For example, a TiW film typically is a mixture with a composition of 10% titanium and 90% tungsten, with these constituent materials being mixed together in a same layer. Using a TiW film as a liner for a tungsten via has the disadvantage that Ti of the TiW mixture is exposed during the tungsten CVD process used to form the via, and the exposed Ti produces an unwanted chemical reaction with the HF used in the tungsten CVD process. In contrast, the multilayer Ti/W liner described herein includes two distinct and separate layers including a first layer of pure Ti and a second layer of pure W. The layer of pure Ti is directly on the Cu of the wire 102 such that there is no nitride material on the Cu at the via-to-wire interface. Moreover, the Ti is covered by the layer of pure W that is deposited using an ionized PVD process, such that the Ti does not react with other constituents during the W CVD process used to form the via 123. Further, neither of the layers of the multilayer Ti/W liner comprises nitride, which advantageously avoids nitrogen poisoning of the layer that directly contacts the Cu interconnect.

Figure 9:
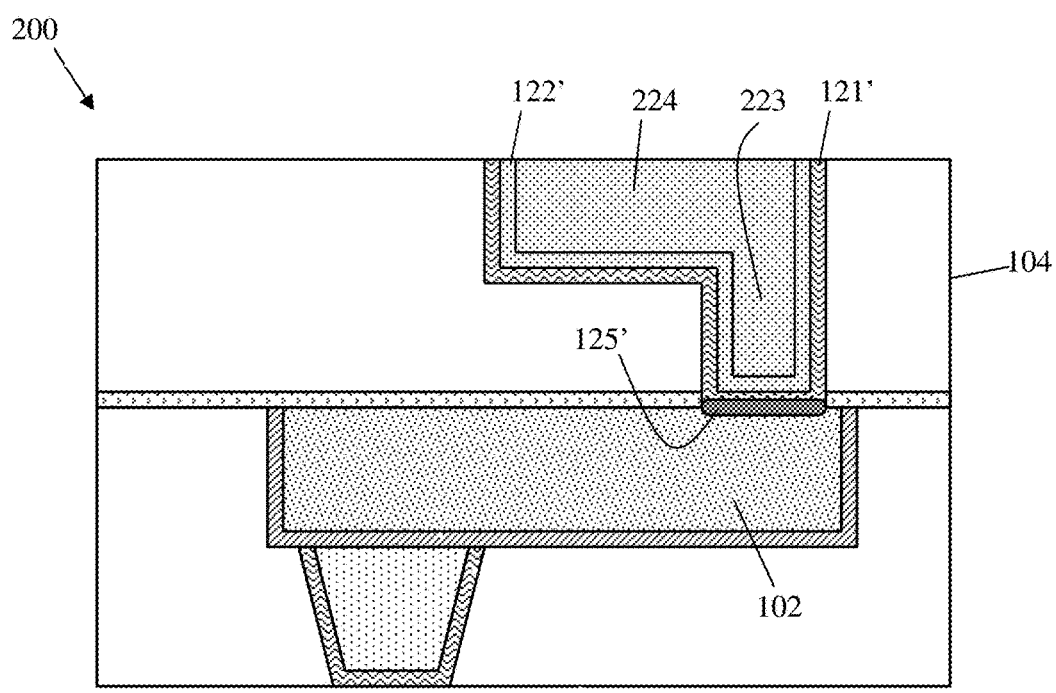
FIG. 9 shows a structure in accordance with aspects of the invention.

FIG. 9 shows a dual-damascene implementation in accordance with aspects of the invention. Specifically, FIG. 9 shows a structure 200 comprising a first liner 121' and a second liner 122' around a combined via 223 and wire 224 in the second dielectric layer 104. The structure 200 may be formed using the structure 100 shown in FIG. 2 as a starting point, forming a combined via opening and wire opening in the second dielectric layer 104 (as is understood in conventional dual-damascene processes), and then performing the steps described with respect to FIGS. 4-7. The resultant structure 200 includes the nitride-free, multilayer Ti/W liner between the via 223 and the wire 102. The structure 100' may also include a Cu—Ti alloy region 125' formed in a manner similar to that described with respect to FIGS. 7 and 8.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a via opening that exposes an upper surface of a copper wire;
    forming a titanium liner on the upper surface of the wire;
    forming a tungsten liner on the titanium liner;
    forming a via on the tungsten liner in the via opening;
    cleaning exposed surfaces in the via opening with buffered hydrofluoric acid; and
    maintaining a wafer comprising the wire in one or more chambers of a processing tool, without exposing the wafer to atmosphere, during the forming the via, the forming the titanium liner, and the forming the tungsten liner,
    wherein the via is a tungsten via that has a lower purity than that of the tungsten liner.

2. The method of claim 1, wherein:
    the forming the titanium liner comprises a first ionized physical vapor deposition process; and
    the forming the tungsten liner comprises a second ionized physical vapor deposition process.

3. The method of claim 2, further comprising performing the first ionized physical vapor deposition process and the second ionized physical vapor deposition process without an air break.

4. The method of claim 2, wherein the forming the via comprises a tungsten chemical vapor deposition process.

5. The method of claim 1, wherein the forming the via comprises filling the via opening with tungsten on the tungsten liner.

6. The method of claim 1, wherein the titanium liner and the tungsten liner are devoid of nitride.

7. The method of claim 1, further comprising heating the wafer to form a copper-titanium alloy region between the wire and the titanium liner.

8. The method of claim 1, wherein the forming the via opening comprises forming a combined via and interconnect opening in a dual damascene process.

9. The method of claim 1, wherein:
    the titanium liner is on and directly contacting the upper surface of the wire;
    the tungsten liner is on and directly contacting the titanium liner; and
    the via is on and directly contacting the tungsten liner.

10. The method of claim 9, wherein:
    the titanium liner is pure titanium that is devoid of nitride; and
    the tungsten liner is pure tungsten that is devoid of nitride.

11. A method of forming a semiconductor structure, comprising:
    forming a copper wire in a first layer of dielectric material;
    forming a capping layer on the wire and the first layer of dielectric material;
    forming a second layer of dielectric material on the capping layer;
    etching a via opening in the second layer of dielectric material and the capping layer to expose an upper surface of the wire;
    forming a titanium liner in the via opening and on and directly contacting the upper surface of the wire;
    forming a tungsten liner in the via opening and on and directly contacting the titanium liner; and
    forming a tungsten via in the via opening and on and directly contacting the tungsten liner,
    wherein the tungsten via has a purity lower than a purity of the tungsten liner.

12. The method of claim 11, wherein:
    the forming the titanium liner comprises depositing a layer of pure titanium using a first ionized physical vapor deposition process; and
    the forming the tungsten liner comprises depositing a layer of pure tungsten using a second ionized physical vapor deposition process.

13. The method of claim 12, further comprising performing the first ionized physical vapor deposition process and the second ionized physical vapor deposition process without an air break.

14. The method of claim 11, further comprising preventing nitrogen poisoning of the titanium liner.

15. The method of claim 11, wherein the forming the tungsten via comprises filling the via opening with tungsten using a chemical vapor deposition process.

16. The method of claim 11, further comprising forming a copper-titanium alloy region between the wire and the titanium liner.

17. A semiconductor structure, comprising:
    a copper wire in a first layer of dielectric material;

a capping layer on and contacting the wire and the first layer of dielectric material;

a second layer of dielectric material on the capping layer;

a via opening extending through the second layer of dielectric material and the capping layer to an upper surface of the wire;

a titanium liner in the via opening and on and contacting the upper surface of the wire;

a tungsten liner in the via opening and on the titanium liner; and a tungsten via in the via opening and on the tungsten liner, wherein the titanium liner is pure titanium that is devoid of nitride;

the tungsten liner is pure tungsten that is devoid of nitride; and the tungsten via has a lower purity than that of the tungsten liner.

18. The structure of claim 17, wherein:

the titanium liner directly contacts the wire; and the tungsten liner directly contacts both the titanium liner and the tungsten via.

19. The structure of claim 17, further comprising a Cu—Ti alloy region between the titanium liner and the wire.

* * * * *